(12) United States Patent
Okawa et al.

(10) Patent No.: US 7,242,061 B2
(45) Date of Patent: Jul. 10, 2007

(54) SEMICONDUCTOR DEVICE

(75) Inventors: Kazuhiko Okawa, Chino (JP); Takayuki Saiki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 263 days.

(21) Appl. No.: 10/341,464

(22) Filed: Jan. 14, 2003

(65) Prior Publication Data

US 2003/0151096 A1    Aug. 14, 2003

(30) Foreign Application Priority Data

Jan. 15, 2002    (JP)    ............... 2002-006217

(51) Int. Cl.
*H01L 23/62* (2006.01)
*H01L 29/94* (2006.01)

(52) U.S. Cl. ............ 257/355; 257/356; 257/357; 257/288

(58) Field of Classification Search ........... 257/204, 257/104, 106, 355, 356, 357, 360, 362, 509, 257/368, 98, 395, 219, 296, 205, 200, 206, 257/316, 412, 506; 438/182, 187, 309, 166
See application file for complete search history.

(56) References Cited

U.S. PATENT DOCUMENTS

| | | | | |
|---|---|---|---|---|
| 5,338,957 A | * | 8/1994 | Fukumoto et al. | 257/316 |
| 5,356,821 A | * | 10/1994 | Naruse et al. | 438/234 |
| 5,614,752 A | * | 3/1997 | Takenaka | 257/408 |
| 5,854,097 A | * | 12/1998 | Ohmi et al. | 438/182 |
| 5,936,265 A | * | 8/1999 | Koga | 257/105 |
| 6,034,388 A | * | 3/2000 | Brown et al. | 257/296 |
| 6,323,689 B1 | * | 11/2001 | Morishita | 326/101 |
| 6,507,090 B1 | * | 1/2003 | Hu et al. | 257/586 |
| 6,538,290 B1 | * | 3/2003 | Ishikawa et al. | 257/362 |
| 6,624,495 B2 | * | 9/2003 | Schmidt | 257/509 |

FOREIGN PATENT DOCUMENTS

| JP | A 9-306998 | 11/1997 |
|---|---|---|
| JP | A 11-340460 | 12/1999 |

* cited by examiner

*Primary Examiner*—Sue A. Purvis
*Assistant Examiner*—Fazli Erdem
(74) *Attorney, Agent, or Firm*—Oliff & Berridge, PLC

(57) ABSTRACT

The invention provides semiconductor devices having an output circuit in which transistors do not fail to achieve their original capability, and electrostatic breakdown is difficult to occur. A semiconductor device is equipped with a semiconductor substrate, an element isolation region formed on the semiconductor substrate, a first impurity diffusion region that is formed in the semiconductor substrate and surrounds the element isolation region, a second impurity diffusion region that is formed in the semiconductor substrate, a first wiring electrode and a second wiring electrode that are electrically connected to the first impurity diffusion region on both sides of the element isolation region, an output terminal that outputs signals to outside, a wiring that electrically connects the first wiring electrode and the second wiring electrode to the output terminal, and a third wiring electrode and a fourth wiring electrode that are electrically connected to the second impurity diffusion region corresponding to the first and second wiring electrodes.

1 Claim, 5 Drawing Sheets

SEMICONDUCTOR DEVICE

BACKGROUND OF THE INVENTION

1. Field of Invention

The present invention relates generally to semiconductor devices, and more particularly to semiconductor devices having an output circuit that is provided with an electrostatic protection countermeasure.

2. Description of Related Art

Internal circuits of a semiconductor device may be destroyed if a high voltage due to static electricity is applied to input terminals or output terminals. This type of electrostatic destruction becomes problematic particularly in CMOS type semiconductor devices. A related art semiconductor device is described with reference to FIGS. 6 and 7.

FIG. 6 is a plan view of a related art semiconductor device. FIG. 7 is a cross-sectional view of the related semiconductor device taken along plane B-B' shown in FIG. 6. In FIGS. 6 and 7, an interlayer dielectric film and a wiring layer are omitted. A gate electrode 24 is formed over a P⁻ type semiconductor substrate 20 through a gate dielectric film 23, and sidewalls 25 are formed on side walls of the gate electrode 24. An N⁺ type drain region 26 and an N⁺ type source region 27 are formed in the semiconductor substrate 20 on both sides of the gate electrode 24. A salicide layer 28 is formed on the N⁺ type drain region 26, and the salicide layer 28 is connected to an output terminal through a wiring electrode 32 and a wiring connected thereto. A salicide layer 29 is formed on the N⁺ type drain region 27, and the salicide layer 29 is connected to a wiring to supply a power supply potential $V_{SS}$ on a low potential side through a wiring electrode 31 or 33.

The semiconductor device is designed to protect elements that are connected to the output terminal. More specifically, the wiring electrode 32 is spaced a great distance from the gate electrode 24, such that heat generated at a hot spot (heat generating spot) that occurs adjacent to the gate electrode does not propagate to the wiring electrode 32. Also, salicide layer prohibition regions 30 are provided adjacent to the gate electrode 24.

However, with further miniaturization of semiconductor devices in recent years, impurity diffusion layers tend to be formed shallower. As a result, there is a problem in that current concentration is apt to occur at the drain or the collector, and the electrostatic breakdown voltage of a semiconductor device lowers.

Japanese Laid-open patent application (Tokkai) HEI 9-306998 describes a MOS transistor structure having an electrostatic breakdown preventing circuit. In the MOS transistor structure, the diffusion resistance of the drain region is increased by many isolated islands that are uniformly distributed across the entire drain diffusion layer. However, by simply increasing the diffusion resistance of the drain region, although the MOS transistor may become more resistive against electrostatic breakdown, it fails to achieve its original capacity.

SUMMARY OF THE INVENTION

Therefore, in view of the problems described above, the present invention provides semiconductor devices having an output circuit in which transistors do not fail to achieve their original capacity and electrostatic breakdown is difficult to occur.

To address or solve the problems described above, a semiconductor device in accordance with a first aspect of the present invention includes: a semiconductor substrate; an element isolation region formed on the semiconductor substrate; a first impurity diffusion region that is formed in the semiconductor substrate and surrounds the element isolation region; a second impurity diffusion region that is formed in the semiconductor substrate; a first wiring electrode and a second wiring electrode that are electrically connected to the first impurity diffusion region on both sides of the element isolation region; an output terminal that outputs signals to an exterior of the semiconductor device; a wiring that electrically connects the first wiring electrode and the second wiring electrode to the output terminal; and a third wiring electrode and a fourth wiring electrode that are electrically connected to the second impurity diffusion region corresponding to the first and second wiring electrodes.

The semiconductor device in accordance with the first aspect of the present invention may further include a gate electrode formed over the semiconductor substrate through a dielectric film between the first impurity diffusion region and the second impurity diffusion region.

In addition, a semiconductor device in accordance with a second aspect of the present invention includes: a dielectric substrate having a semiconductor layer formed therein; an element isolation region formed on the semiconductor layer; a first impurity diffusion region that is formed in the semiconductor layer and surrounds the element isolation region; a second impurity diffusion region that is formed in the semiconductor layer; a first wiring electrode and a second wiring electrode that are electrically connected to the first impurity diffusion region on both sides of the element isolation region; an output terminal that outputs signals to an exterior of the semiconductor device; a wiring that electrically connects the first wiring electrode and the second wiring electrode to the output terminal; and a third wiring electrode and a fourth wiring electrode that are electrically connected to the second impurity diffusion region corresponding to the first and second wiring electrodes.

The semiconductor device in accordance with the second aspect of the present invention may further include a gate electrode formed over the semiconductor layer through a dielectric film between the first impurity diffusion region and the second impurity diffusion region.

The above-described semiconductor device may further include a salicide layer that is formed on the first impurity diffusion region. The first and second wiring electrodes may be connected to the first impurity diffusion region through the salicide layer.

Also, the third and fourth wiring electrodes may be electrically connected to a wiring to supply a power supply potential on a high potential side or a low potential side.

In accordance with the invention thus structured, current concentration can be avoided or substantially avoided, even when a hot spot is generated in the first impurity diffusion region, and therefore the present invention provides semiconductor devices having an output circuit in which the transistors do not fail to achieve their original capacity and electrostatic breakdown is difficult to occur. Also, since a salicide layer is formed on the first impurity diffusion region, the sheet resistance value of the drain or the collector can be lowered. In this instance, it is not necessary to provide a salicide layer prohibition region at the drain or the collector. When a process is included to block a salicide layer at elements other than those of an electrostatic protection circuit, such as resistances, salicide blocks at edges of the diffusion regions can be used to enhance the effects.

DETAILED DESCRIPTION OF PREFERRED EMBODIMENTS

Embodiments of the present invention is described in detail below with reference to the accompanying drawings. The same elements are indicated by the same reference numbers, and their description will not be repeated.

Figure 1:
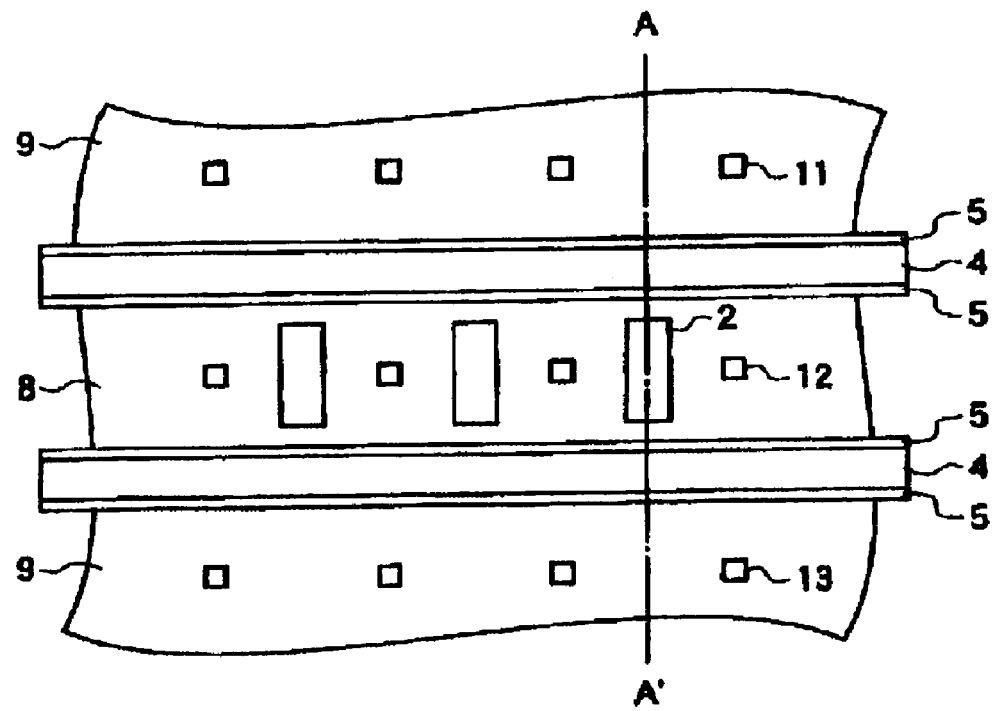
FIG. 1 is a plan view of a semiconductor device in accordance with a first embodiment of the present invention.
Figure 2:
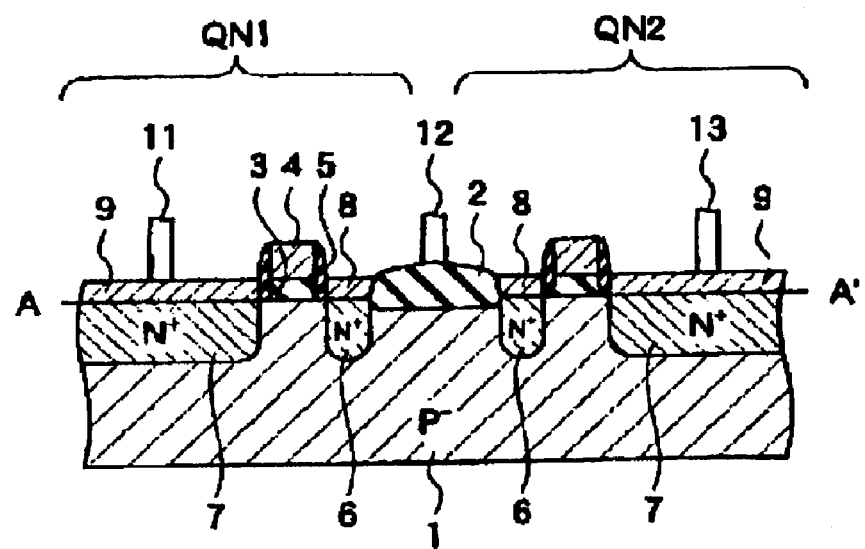
FIG. 2 is a cross-sectional view taken along plane A-A' (shown in FIG. 1) of the semiconductor device in accordance with the first embodiment of the present invention.
Figure 3:
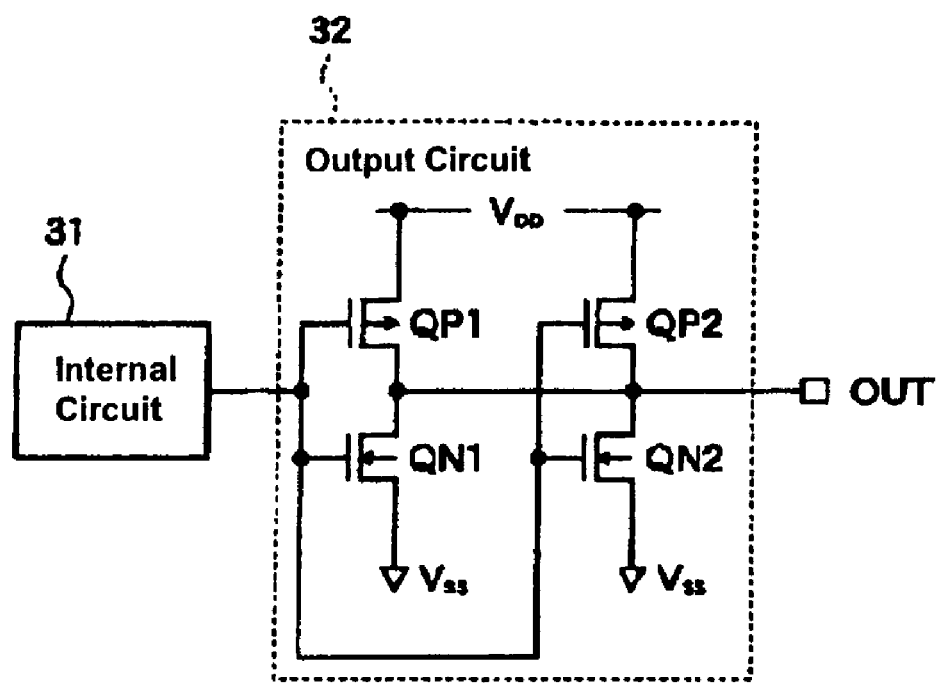
FIG. 3 is a circuit diagram in part of a circuit that is built in a semiconductor device in accordance with the first embodiment of the present invention.

FIG. 1 is a plan view of a semiconductor device in accordance with a first embodiment of the present invention. FIG. 2 is a cross-sectional view taken along plane A-A' (shown in FIG. 1) of the semiconductor device in accordance with the first embodiment of the present invention. In FIGS. 1 and 2, interlayer dielectric films and wring layers are omitted. FIG. 3 is a circuit diagram in part of a circuit that is built in a semiconductor device in accordance with the present embodiment.

As shown in FIG. 3, the semiconductor device in accordance with the present embodiment includes an internal circuit 31, an output circuit 32 and an output terminal OUT. The output circuit 32 includes a P channel MOS transistors QP1 and QP2 and N channel MOS transistors QN1 and QN2, each having a gate to which signals are supplied from the internal circuit 31. Sources of the transistors QP1 and QP2 are connected to a power supply potential $V_{DD}$ on a high potential side, and their drains are connected to the output terminal OUT. On the other hand, sources of the transistors QN1 and QN2 are connected to a power supply potential $V_{SS}$ on a low potential side (a ground potential in the present embodiment), and their drains are connected to the output terminal OUT.

FIGS. 1 and 2 show a structure of the transistors QN1 and QN2 indicated in FIG. 3. An element isolation region 2 is formed with a silicon oxide film or the like on the semiconductor substrate 1 that is formed of P⁻ type silicon or the like. Also, a gate electrode 4 of polysilicon or the like is formed over the semiconductor substrate 1 through the gate dielectric film 3, and sidewalls 5 of silicon oxide films or the like are formed on side walls of the gate electrode 4.

An N⁺ type drain region 6 and an N⁺ type source region 7 are formed in the semiconductor substrate 1 on both sides of the gate electrode 4. In the present embodiment, a salicide layer is formed on the impurity diffusion region, thereby lowering the sheet resistance value of the drain and source, which is ordinarily 60-100 Ω/sq., to about 10 Ω/sq. A salicide layer 8 is formed on the N⁺ type drain region 6, and the salicide layer 8 is connected to the output terminal OUT (see FIG. 3) through the wiring electrode 12 and a wiring connected thereto. A salicide layer 9 is formed on the N⁺ type source region 7, and the salicide layer 9 is connected to a wiring to supply the power supply potential $V_{SS}$ on a low potential side through the wiring electrode 11 or 13.

In the present embodiment, as indicated in FIGS. 1 and 2, the N⁺ type drain region 6 and the salicide layer 8 are formed in a manner to surround the element isolation region 2. As a result, a region where no impurity diffusion layer or salicide layer 4 are formed is created to exist in the region where an impurity diffusion layer would have been formed in the related art. Current is difficult to flow in the element isolation region 2, such that current concentration can be avoided even when a hot spot is generated in the drain region 6. Also, a salicide layer prohibition region, which would have been provided in prior art, does not need to be provided.

Figure 4:
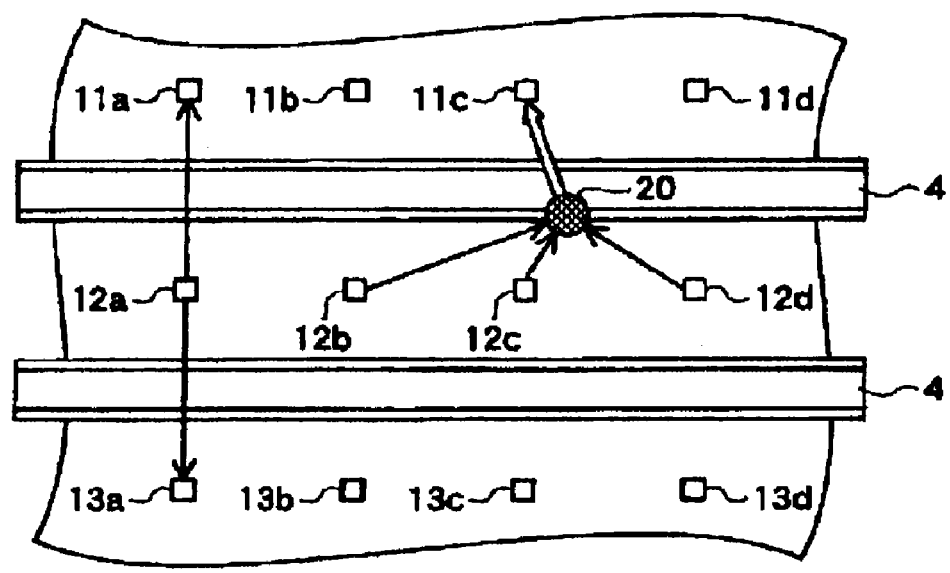
FIG. 4(a) is a schematic indicating a current flow in the case where no element isolation region is provided.
FIG. 4(b) is a schematic that shows a current flow in the case where an element isolation region is provided.
Figure 4:
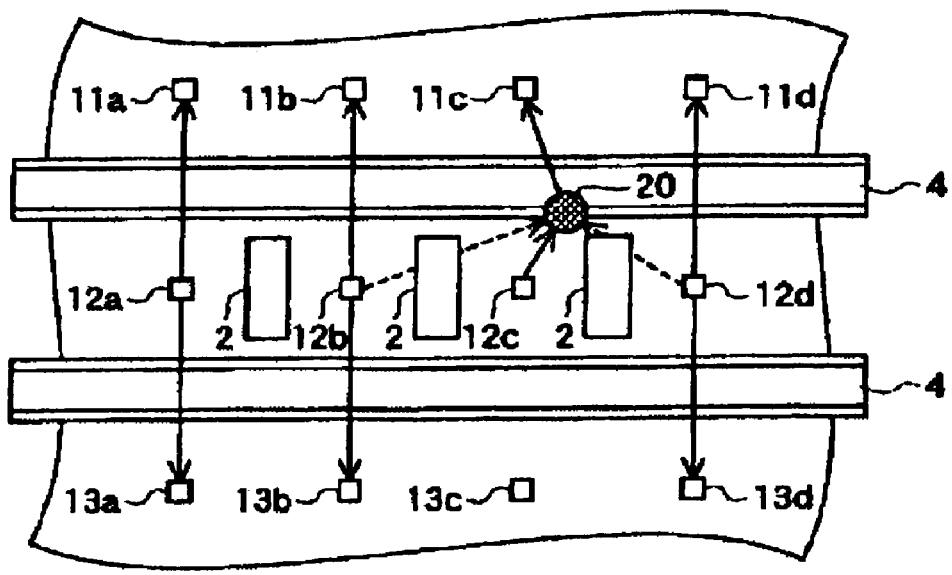

This aspect is described with reference to FIGS. 4(a) and 4(b). FIG. 4(a) is a schematic indicating a current flow in the case where no element isolation region is provided, and FIG. 4(b) is a schematic that shows a current flow in the case where an element isolation region is provided. In FIGS. 4(a) and (b), in three of the impurity diffusion regions and salicide layers that are separated by the gate electrodes 4 of two of the transistors, source electrodes 11a-11d of one of the transistors, drain electrodes 12a-12d of both of the transistors and source electrodes 13a-13d of the other transistor are electrically connected, respectively.

In these impurity diffusion regions and salicide layers, current that is supplied from the drain electrode 12a should preferably flow toward the source electrodes 11a and 13a, current that is supplied from the drain electrode 12b should preferably flow toward the source electrodes 11b and 13b, current that is supplied from the drain electrode 12c should preferably flow toward the source electrodes 11c and 13c, and current that is supplied from the drain electrode 12d should preferably flow toward the source electrodes 11d and 13d.

However, once a hot spot 20 is generated at a drain adjacent to the gate electrode 4, the specific resistance of semiconductor, such as silicon, lowers due to the elevated temperature, and as shown in FIG. 4(a), currents concentrate on the hot spot 20. In contrast, as indicated in FIG. 4(b), when the element isolation region 2 is provided at the drains, the element isolation region 2 blocks currents that may flow into a hot spot 20 from the drain electrodes 12b and 12d adjacent to the drain electrode 12c that is located near the hot spot 20, such that concentration of currents on the hot spot 20 can be avoided or reduced. As a result, elements that are connected to the output terminal can be protected.

Next, a second embodiment of the present invention is described below. The present embodiment is different from the first embodiment in that it uses a SOI (silicon on insulator) substrate, but is the same in other aspects as the first embodiment.

Figure 5:
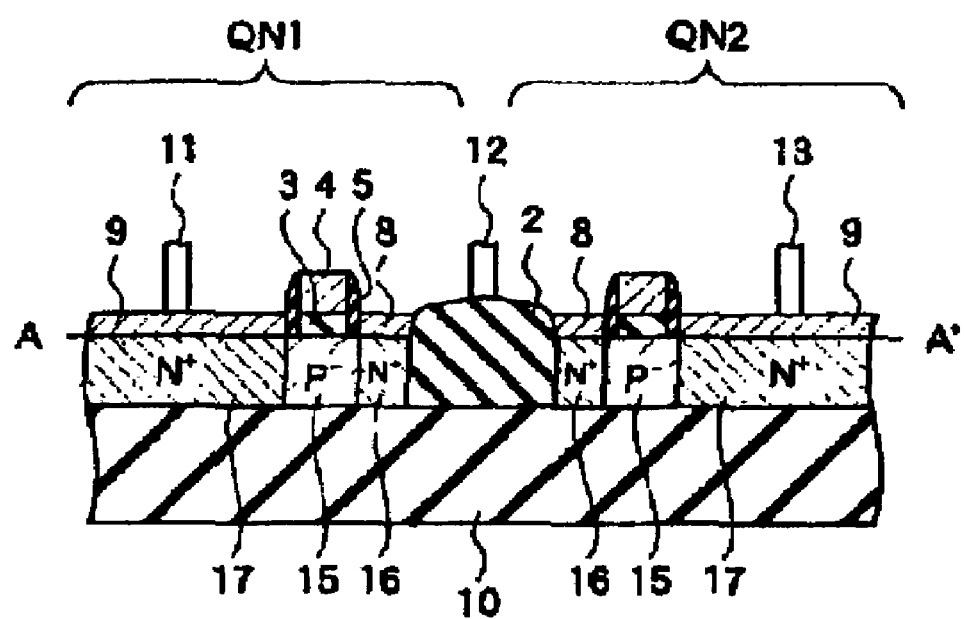
FIG. 5 is a cross-sectional view taken along plane A-A' (shown in FIG. 1) of a semiconductor device in accordance with a second embodiment of the present invention.
Figure 6:
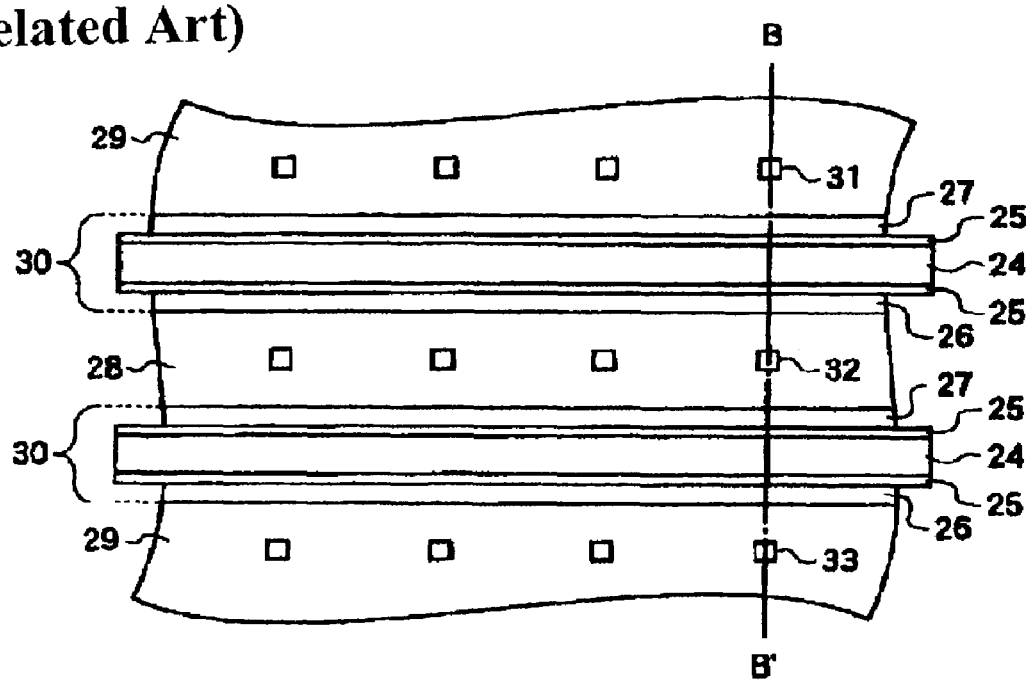
FIG. 6 is a plan view of a related art semiconductor device.
Figure 7:
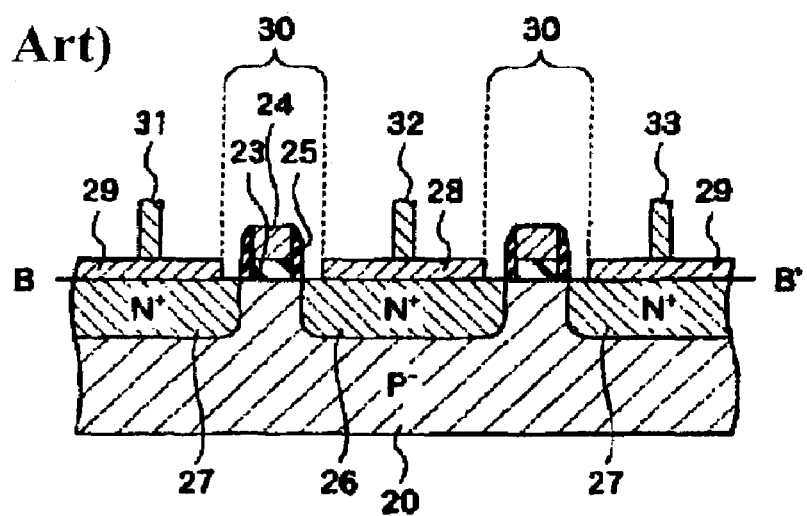
FIG. 7 is a cross-sectional view taken along plane B-B' (shown in FIG. 6) of the related art semiconductor device.

FIG. 5 is a cross-sectional view taken along plane A-A' (shown in FIG. 1) of a semiconductor device in accordance with a second embodiment of the present invention. Also in FIG. 5, interlayer dielectric films and wiring layers are omitted.

The semiconductor device is formed with single crystal silicon grown on a dielectric substrate 10, such as sapphire, quartz or the like. As shown in FIG. 5, an element isolation region 2 is formed with a silicon oxide film or the like on the dielectric substrate 10. Also, a gate electrode 4 formed of polysilicon or the like is formed over a P⁻ type single crystal silicon layer 15 through a gate dielectric film 3, and sidewalls 5 formed of silicon oxide films or the like are formed on side walls of the gate electrode 4.

An N⁺ type drain region 16 and an N⁺ type source region 17 are formed in the single crystal silicon layer on both sides of the gate electrode 4. Also in the present embodiment, a salicide layer is formed on the impurity diffusion region, thereby lowering the sheet resistance value of the drain and source. A salicide layer 8 is formed on the N⁺ type drain region 16, and the salicide layer 8 is connected to the output terminal OUT (see FIG. 3) through the wiring electrode 12 and a wiring connected thereto. A salicide layer 9 is formed on the N⁺ type source region 17, and the salicide layer 9 is connected to a wiring to supply the power supply potential $V_{SS}$ on a low potential side through the wiring electrode 11 or 13.

In the structure using the SOI substrate described above, parasitic capacitance of the MOS transistors can be reduced, and good high frequency characteristics can be obtained. However, there is a greater possibility of electrostatic breakdown, since a large current due to static electricity may flow in a surface layer portion of the semiconductor device. In accordance with the present embodiment, in semiconductor devices that use a SOI substrate, concentration of currents on a hot spot can be effectively avoided or substantially avoided, and elements that are connected to an output terminal can be protected.

In the embodiments described above, a description is provided as to circuit examples that accommodate P type substrates grounded to a power supply potential $V_{SS}$ on a low potential side. However, the present invention is also applicable to circuits that accommodate N type substrates grounded to a power supply potential $V_{DD}$ on a high potential side. In such cases, effects similar to those of the above-described embodiment can be obtained. Also, the present invention is not only applicable to CMOS transistor structures, but also to other structures, such as bipolar transistor structures, for example.

As described above, in accordance with the present invention, current concentration can be avoided or substantially avoided, even when a hot spot is generated at a drain or a collector, and therefore semiconductor devices having an output circuit in which the transistors do not fail to achieve their original capacity and electrostatic breakdown is difficult to occur can be provided. Also, since a salicide layer is formed on a first impurity diffusion region, the sheet resistance value of the drain or the collector can be lowered. In this instance, it is not necessary to provide a salicide layer prohibition region at the drain or the collector.

What is claimed is:

1. A semiconductor device, including:
    a MOS transistor formed on a semiconductor substrate;
    first and second wiring electrodes electrically connected to a drain diffusion layer of the MOS transistor; and
    third and fourth wiring electrodes electrically connected to a source diffusion layer of the MOS transistor,
    wherein an element isolation region is provided between the first and second wiring electrodes, and the wiring electrodes respectively arranged in the drain diffusion layer and the source diffusion layer are arranged opposing each other, with the gate electrode of the MOS transistor therebetween.

* * * * *